(12) United States Patent
Nonaka et al.

(10) Patent No.: US 11,100,258 B2
(45) Date of Patent: Aug. 24, 2021

(54) REPAIR PLAN DRAFTING SUPPORT SYSTEM, METHOD, AND PROGRAM

(71) Applicant: FUJIFILM Corporation, Tokyo (JP)

(72) Inventors: Shunichiro Nonaka, Tokyo (JP); Masayuki Negoro, Tokyo (JP); Satoshi Kubota, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 468 days.

(21) Appl. No.: 15/907,492

(22) Filed: Feb. 28, 2018

(65) Prior Publication Data
US 2018/0189423 A1  Jul. 5, 2018

Related U.S. Application Data (63) Continuation of application No. PCT/JP2016/057929, filed on Mar. 14, 2016.

(30) Foreign Application Priority Data

Sep. 24, 2015 (JP) ............................ JP2015-187186

(51) Int. Cl.
*G06F 30/13* (2020.01)
*G06Q 10/06* (2012.01)
(Continued)

(52) U.S. Cl.
CPC ....... *G06F 30/13* (2020.01); *G06Q 10/06313* (2013.01); *G06Q 10/06316* (2013.01); *G06Q 10/20* (2013.01); *G06Q 50/08* (2013.01)

(58) Field of Classification Search
CPC .. G06Q 50/08; G06Q 10/06316; G06Q 10/20; G06Q 10/06313; G06F 30/13
(Continued)

(56) References Cited

U.S. PATENT DOCUMENTS 5,421,204 A * 6/1995 Svaty, Jr. ............ G01M 5/0033
                                                            73/786
5,533,413 A * 7/1996 Kobayashi ............... G07C 3/00
                                                            73/865.9
(Continued)

FOREIGN PATENT DOCUMENTS

CN  102505641 A  6/2012
CN  103984858 A  8/2014
(Continued)

OTHER PUBLICATIONS

Communication pursuant to Article 94(3) EPC issued by the European Patent Office dated Jun. 24, 2019, which corresponds to European Patent Application No. 16848341.0-1222 and is related to U.S. Appl. No. 15/907,492.
(Continued)

*Primary Examiner* — Juan C Ochoa
(74) *Attorney, Agent, or Firm* — Studebaker & Brackett PC (57) ABSTRACT

A structural object information search unit (18) acquires structural object specification information of the target structural object from the inspection result information, and searches for structural object information of a reference structural object stored in a structural object information DB (50). The structural object information search unit (18) specifies similar reference structural object similar to the target structural object. An inspection result similarity determination unit (24) acquires inspection and/or repair information of the similar reference structural object from the structural object information DB (50), compares the inspection and/or repair information of the similar reference structural object with a inspection result of the target structural object, and specifies inspection result information of the reference structural object used in generation of a repair
(Continued)

plan. The repair plan generation unit (20) generates a repair plan of the target structural object based on the specified inspection result information.

17 Claims, 8 Drawing Sheets

(51) Int. Cl.
  *G06Q 50/08* (2012.01)
  *G06Q 10/00* (2012.01)
(58) Field of Classification Search
  USPC .......................................................... 703/1
  See application file for complete search history.

(56) References Cited

U.S. PATENT DOCUMENTS

| | | | |
|---|---|---|---|
| 8,527,550 B1 * | 9/2013 | Quintana | G06Q 10/20 707/802 |
| 2015/0250553 A1 * | 9/2015 | Jaramaz | G16B 5/00 703/1 |

FOREIGN PATENT DOCUMENTS

| | | | |
|---|---|---|---|
| CN | 104809359 A | | 7/2015 |
| JP | 2005-115687 A | | 4/2005 |
| JP | 2006-063537 A | | 3/2006 |
| JP | 2007058496 | * | 3/2007 |
| JP | 2007-140608 A | | 6/2007 |
| JP | 2007-280282 A | | 10/2007 |
| WO | 2015-029170 A1 | | 3/2015 |

OTHER PUBLICATIONS

International Search Report; issued in PCT/JP2016/057929; dated Jun. 7, 2016.
Written Opinion; issued in PCT/JP2016/057929; dated Jun. 7, 2016.
An Office Action mailed by the European Patent Office dated Dec. 24, 2019, which corresponds to European Patent Application No. 168480341.0-1222 and is related to U.S. Appl. No. 15/907,492.
An Office Action mailed by the European Patent Office dated Dec. 10, 2019, which corresponds to European Patent Application No. 16848341.0-1222 and is related to U.S. Appl. No. 15/907,492.
The extended European search report issued by the European Patent Office dated Jun. 1, 2018, which corresponds to European Patent Application No. 16848341.0-1222 and is related to U.S. Appl. No. 15/907,492.
An Office Action mailed by China National Intellectual Property Administration dated Feb. 25, 2021, which corresponds to Chinese Patent Application No. 201680054228.6 and is related to U.S. Appl. No. 15/907,492; with English language translation.

* cited by examiner

| ID NUMBER | STRUCTURAL OBJECT NAME (BRIDGE NAME) | STRUCTURAL OBJECT ATTRIBUTE INFORMATION (BRIDGE ATTRIBUTE INFORMATION) ||||| PREVIOUS INSPECTION RESULT ||| PREVIOUS REPAIR RESULT |||
|---|---|---|---|---|---|---|---|---|---|---|---|---|
| | | STRUCTURE | REGION | NUMBER OF YEARS OF CONSTRUCTION | ANTI-FREEZER SPRAY HISTORY | CONTRACTOR | CONCRETE MEMBER EVALUATION | STEEL MEMBER EVALUATION | PREVIOUS INSPECTION | REPAIR TIMING | REPAIR CONTENT | AFTER REPAIR |
| 1 | A BRIDGE | STEEL PLATE GIRDER | SEASHORE | 10 YEARS | THREE TIMES /YEAR | X COMPANY | A | B | OCTOBER 2010 | NO REPAIR | | |
| 2 | B BRIDGE | PC BOX GIRDER | PLAIN | 15 YEARS | TWO TIMES /YEAR | Y COMPANY | A | C | JUNE 2012 | NO REPAIR | | |
| 3 | C BRIDGE | PC BOX GIRDER | FOOT OF MOUNTAIN | 32 YEARS | FIVE TIMES /YEAR | Z COMPANY | B | A | JANUARY 2013 | NO REPAIR | | |
| 4 | D BRIDGE | STEEL BOX GIRDER | SEASHORE | 70 YEARS | NO HISTORY | X COMPANY | B | C | FEBRUARY 2014 | FEBRUARY 2015 | REPLACEMENT OF FLOOR PLATE | NO PROBLEM |
| 5 | E BRIDGE | STEEL PLATE GIRDER | FOOT OF MOUNTAIN | 41 YEARS | NO HISTORY | Y COMPANY | C | B | MARCH 2014 | MARCH 2015 | CRACK REPAIR | RECURRENCE WITHIN ONE YEAR |
| ... | | | | | | | | | | | | |

FIG. 4

| ID NUMBER | STRUCTURAL OBJECT NAME (BRIDGE NAME) | STRUCTURE | REGION | NUMBER OF YEARS OF CONSTRUCTION | ANTI-FREEZER SPRAY HISTORY | CONTRACTOR | CONCRETE MEMBER EVALUATION | STEEL MEMBER EVALUATION | PREVIOUS INSPECTION | NEXT REPAIR | REPAIR CONTENT |
|---|---|---|---|---|---|---|---|---|---|---|---|
| P | P BRIDGE | STEEL PLATE GIRDER | SEASHORE | 60 YEARS | NO HISTORY | Z COMPANY | B | C | OCTOBER 2016 | OCTOBER 2017 | REPLACEMENT OF FLOOR PLATE |

REPAIR PLAN DRAFTING SUPPORT SYSTEM, METHOD, AND PROGRAM

CROSS-REFERENCE TO RELATED APPLICATIONS

This application is a Continuation of PCT International Application No. PCT/JP2016/057929 filed on Mar. 14, 2016, which claims priority under 35 U.S.C § 119(a) to Patent Application No. 2015-0187186 filed in Japan on Sep. 24, 2015, all of which are hereby expressly incorporated by reference into the present application.

BACKGROUND OF THE INVENTION

1. Field of the Invention

The present invention relates to repair plan drafting support system, method, and non-transitory computer readable recording medium storing program, and particularly, to repair plan drafting support system, method, and non-transitory computer readable recording medium storing program for supporting repair plan drafting of a structural object such as a bridge.

2. Description of the Related Art

JP 2007-140608A discloses a structural object repairing plan support system that drafts a repair service plan of a civil engineering structural object. In the structural object repairing plan support system, repairing methods are appropriately selected with consideration for a type of a structural object, a portion of a structural object, a deterioration factor, a repairing effect, a deterioration rate, and necessary cost, repairing method data which is a data set correlated with the repairing methods is stored in a repairing method database, the repairing method database is searched by using factor data, a structural object as a repairing service target or a target portion, or a repairing effect as a key, and the repairing methods are displayed so as to be enumerated (paragraphs <0028>, <0029>, and <0070>).

SUMMARY OF THE INVENTION

In JP 2007-140608A, the repairing methods of the target structural object as the repairing service target are displayed so as to be enumerated by using the item selected by an operator as the key, and the repairing methods to be displayed so as to be enumerated may be changed depending on the key selected by the operator. As stated above, in JP 2007-140608A, since the repairing methods to be enumerated may be changed by the system depending on the deteiinination of the user, it is difficult to suggest objective and high-accurate repairing methods corresponding to a current situation of the target structural object.

The present invention has been made in view of such circumstances, and an object of the present invention is to provide repair plan drafting support system, method, and non-transitory computer readable recording medium storing program capable of supporting the drafting of an objective and high-accurate repair plan by easy means in considering the repairing of a target structural object.

In order to solve the above-described problem, a repair plan drafting support system according to a first aspect of the present invention comprises recording unit that records past inspection results and past repair results of reference structural objects, input unit that receiving an input of an inspection result of a target structural object which is a drafting target of the repair plan, generation unit that compares the past inspection results and the past repair results of the reference structural objects with the inspection result of the target structural object, and generating a repair plan of the target structural object, and output unit that outputs the repair plan generated by the generation means.

According to the present aspect, the inspection result information items of the reference structural objects are compared based on the inspection result information of the target structural object, and thus, it is possible to draft an objective and high-accurate repair plan by easy means. Thus, it is possible to more effectively support the drafting of the repair plan.

According to a repair plan drafting support system according to a second aspect of the present invention, in the first aspect, the generation means extracts the past inspection result and the past repair result of the reference structural object which is similar to the inspection result of the target structural object, and generates the repair plan based on the extracted inspection result and repair result.

According to a repair plan drafting support system according to a third aspect of the present invention, in the first aspect, the recording means records attribute information including at least one of utilization information, environment information, or structure information of the reference structural object together with the inspection result and the repair result of the reference structural object, the input means receives an input of attribute information of the target structural object in a case where the inspection result is input, and the generation means determines a similarity between the target structural object and the reference structural object by comparing the attribute information items of the reference structural object and the target structural object, extracts the past inspection result similar to the inspection result of the target structural object among the past inspection results and the past repair results of the reference structural objects, and generates the repair plan based on the extracted inspection result and the repair result corresponding to the inspection result.

According to a repair plan drafting support system according to a fourth aspect of the present invention, in the first aspect, the recording means records attribute information including at least one of utilization information, environment information, or structural information for every inspection target portion of the reference structural object together with the inspection result and the repair result of the reference structural object, the input means receives an input of attribute information for every inspection target portion of the target structural object in a case where the inspection result is input, and the generation means determines a similarity between the inspection target portions of the reference structural object and the target structural object by comparing the attribute information items of the inspection target portions of the reference structural object and the target structural object, extracts the past inspection result similar to the inspection result of the inspection target portion of the target structural object among the past inspection results and the past repair results of the inspection target portions of the reference structural objects, and generates the repair plan based on the extracted inspection result and the repair result corresponding to the inspection result.

According to a repair plan drafting support system according to a fifth aspect of the present invention, in the third or fourth aspect, the generation means generates multidimensional parameters by digitizing the attribute information items of the reference structural object and the target structural object, and determines that the shorter a Euclid distance between the multi-dimensional parameters, the higher the similarity between the target structural object and the reference structural object.

According to a repair plan drafting support system according to a sixth aspect of the present invention, in the third to fifth aspects, the generation means generates multi-dimensional parameters by digitizing the past inspection result of the reference structural object and the inspection result of the target structural object, and determines that the shorter a Euclid distance between the multi-dimensional parameters, the higher a similarity between the inspection results.

According to a repair plan drafting support system according to a seventh aspect of the present invention, in the first to sixth aspects, the generation means acquires a degree of damage of the target structural object changing with time for a predetermined past period among the past inspection results and the past repair results of the reference structural objects at multiple past points of time, predicts a progression of the damage based on the inspection result of the damage, and generates the repair plan based on the prediction result of the progression of the damage.

According to a repair plan drafting support system according to an eighth aspect of the present invention, in the seventh aspect, the generation means gives a high repair priority to a portion in which it is predicted that the progression of the damage is to be rapid.

According to a repair plan drafting support system according to a ninth aspect of the present invention, in the seventh or eighth aspect, the repair plan drafting support system further comprises preferential inspection portion information acquisition unit that acquires preferential inspection portion information indicating a preferential inspection portion of the target structural object to which a high repair priority is given. The generation means estimates a progression direction and a progression rate of the damage based on the prediction result of the progression of the damage, and generates the repair plan based on a relationship between the estimation result of the progression direction and the progression rate of the damage and the preferential inspection portion.

According to a repair plan drafting support system according to a tenth aspect of the present invention, in the ninth aspect, the repair plan drafting support system further comprises preferential inspection portion specification unit that generates the preferential inspection portion information by specifying the preferential inspection portion of the inspection target portions of the target structural object based on at least one information of information regarding importance of the inspection target portion in terms of structure, design information of the inspection target portion, or environment information in which the inspection target portion is positioned.

According to a repair plan drafting support system according to an eleventh aspect of the present invention, in the first to tenth aspects, the repair plan drafting support system further comprises plan input unit that receives an input of at least one plan of an inspection plan or a repair plan of the target structural object. The generation means generates the repair plan based on the plan received by the plan input means.

According to a repair plan drafting support system according to a twelfth aspect of the present invention, in the eleventh aspect, the plan input means receives an input of a predetermined inspection timing of the target structural object, and the generation means matches an inspection or repair timing of the target structural object with the inspection timing based on the repair plan.

According to a repair plan drafting support system according to a thirteenth aspect of the present invention, in the twelfth aspect, the output means outputs a cost estimate and an effect to be predicted for every generated repair plan in a comparable format.

A repair plan drafting support method according to a fourteenth aspect of the present invention comprises recording past inspection results and past repair results of reference structural objects, receiving an input of an inspection result of a target structural object which is a drafting target of the repair plan, and comparing the past inspection results and the past repair results of the reference structural objects with the inspection result of the target structural object and generating a repair plan of the target structural object, and outputting the generated repair plan.

A non-transitory computer readable recording medium storing repair plan drafting support program according to a fifteenth aspect of the present invention causes a computer to realize a recording function of recording past inspection results and past repair results of reference structural objects, an input function of receiving an input of an inspection result of a target structural object which is a drafting target of the repair plan, a generation function of comparing the past inspection results and the past repair results of the reference structural objects with the inspection result of the target structural object and generating a repair plan of the target structural object, and an output function of outputting the repair plan generated through the generation function.

According to the present invention, the inspection result information items of the reference structural objects are compared based on the inspection result information of the target structural object, and thus, it is possible to draft an objective and high-accurate repair plan by easy means. Thus, it is possible to more effectively support the drafting of the repair plan.

DESCRIPTION OF THE PREFERRED EMBODIMENTS

Hereinafter, repair plan drafting support system, method, and program according to a preferred embodiment of the present invention will be described with reference to the accompanying drawings.

[Configuration of Repair Plan Drafting Support System]

Figure 1:
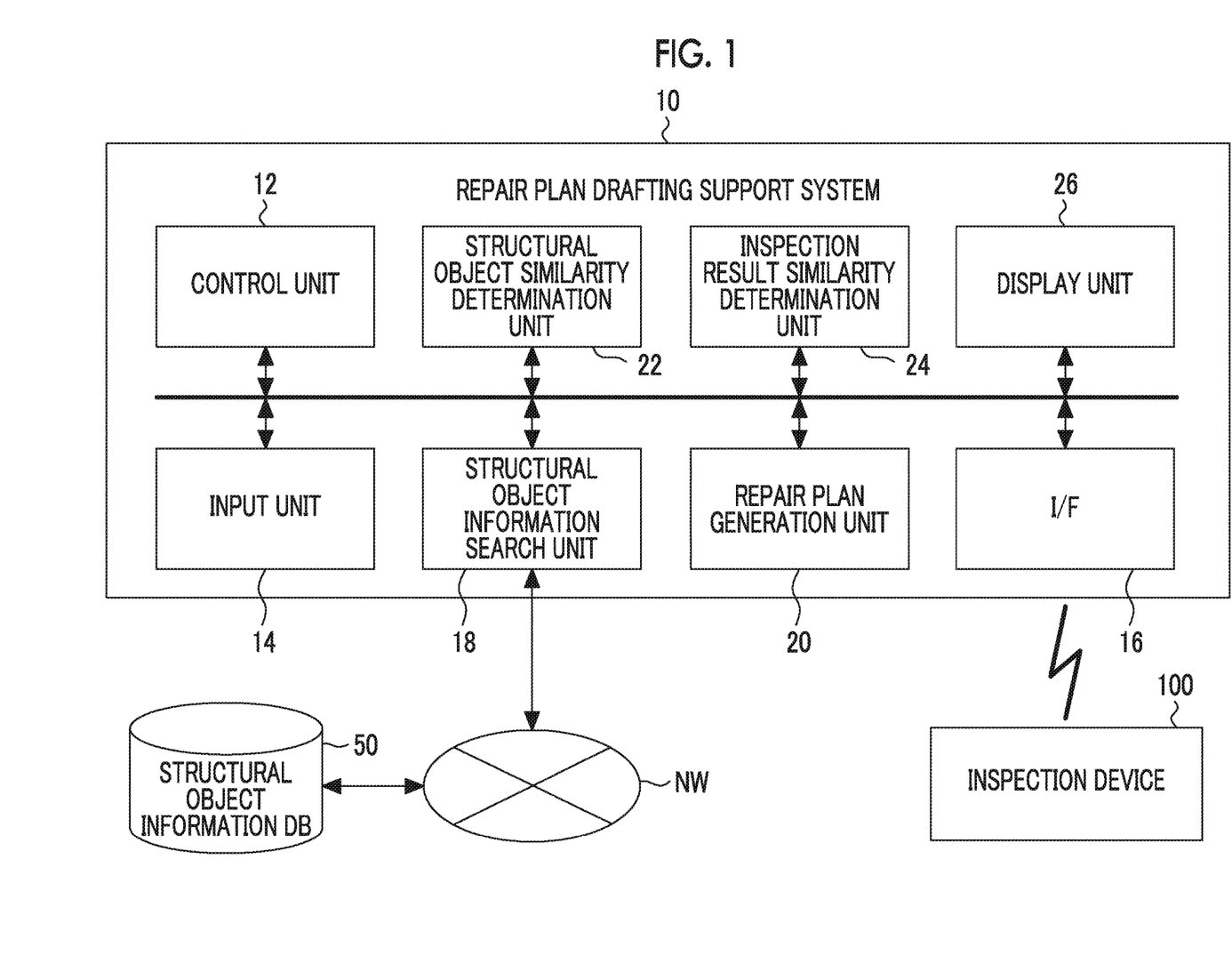
FIG. 1 is a block diagram showing a configuration of a repair plan drafting support system according to an embodiment of the present invention.

FIG. 1 is a block diagram showing a configuration of a repair plan drafting support system according to an embodiment of the present invention.

A repair plan drafting support system 10 according to the present embodiment includes a control unit 12, an input unit 14, a communication interface (I/F) 16, a structural object information search unit 18, a repair plan generation unit 20, a structural object similarity determination unit 22, an inspection result similarity determination unit 24, and a display unit 26.

The control unit 12 includes a central processing unit (CPU) for controlling operations of the units of the repair plan drafting support system 10, a read only memory (ROM) that stores a control program, and a synchronous dynamic random access memory (SDRAM) capable of being used as a work area of the CPU. The control unit 12 receives an operation input of an operator through an input unit 14, transmits a control signal corresponding to the operation input to the unit of the repair plan drafting support system 10 through a bus, and controls the operation of the unit.

The repair plan drafting support system 10 includes the communication interface (I/F) 16 (input means), and is able to communicate with an inspection device 100 through the I/F 16. Wired communication (for example, connection using a universal serial bus (USB)) cable, a local area network (LAN), a wide area network (WAN), or Internet connection) or wireless communication (for example, LAN, WAN, Internet connection, Bluetooth (registered trademark), or infrared communication) may be used as a communication method between the repair plan drafting support system 10 and the inspection device 100.

According to an operation input of the input unit 14, the control unit 12 starts communication with the inspection device 100, and acquires inspection result information of a target structural object from the inspection device 100. An input method of the inspection result information is not limited to be performed through the communication. For example, the inspection result information of the target structural object may be input to the repair plan drafting support system 10 from the inspection device 100 through a recording medium (for example, USB memory or SD card (registered trademark).

The structural object information search unit 18 may communicate with a structural object information database (structural object information DB) 50 through a network NW. Wired communication (for example, LAN, WAN, or Internet connection) or wireless communication (for example, LAN, WAN, Internet connection, Bluetooth (registered trademark), or infrared communication) may be used as a communication method between the structural object information search unit 18 and the structural object information DB 50.

The structural object information DB 50 is recording unit that stores structural object information items (including information (structural object specification information) for specifying the structural object and past inspection and/or repair information) of the target structural object and a plurality of structural objects (hereinafter, the target structural object and the plurality of structural objects other than the target structural object are collectively referred to as a reference structural object) other than the target structural object.

The structural object information search unit 18 searches for the structural object information within the structural object information DB 50, and acquires inspection and/or repair information of the reference structural object similar to the inspection result information of the target structural object acquired from the inspection device 100.

In the present embodiment, the structural object information DB 50 is provided separately from the repair plan drafting support system 10, and information items of inspection results from a plurality of repair plan drafting support systems 10 capable of communicating with the structural object information DB 50 are able to be input. The structural object information DB 50 may be included in the repair plan drafting support system 10.

The structural object similarity determination unit 22 (generation means) compares structural object attribute information included in the structural object information regarding the reference structural object within the structural object information DB 50, which is acquired by the structural object information search unit 18, with structural object attribute information of the target structural object, specifies the reference structural object similar to the target structural object, and extracts the structural object information of the specified reference structural object.

The inspection result similarity determination unit 24 (generation means) acquires inspection and/or repair information (including inspection result information and repair result information) of each inspection target portion (inspection portion) of the reference structural object from the structural object information of the reference structural object specified by the structural object similarity determination unit 22, compares the acquired inspection and/or repair information items with the inspection result information of the target structural object, and extracts inspection result information on the inspection portion of the reference structural object similar to the inspection result information of the target structural object and repair result information corresponding to the inspection result information.

The repair plan generation unit 20 (generation means) generates a repair plan of the target structural object based on the inspection result information items and the repair result information items (at multiple points of time) of the reference structural object acquired by the structural object information search unit 18 and the inspection result information of the target structural object, and outputs the generated repair plan to the display unit 26.

The display unit 26 (output means) is means (for example, liquid crystal display) for displaying an image (for example, photographs indicating an inspection result and a repair result, and a change of the inspection portion with time) or an operation graphical user interface (GUI) of the repair plan drafting support system 10, and displays the repair plan generated by the repair plan generation unit 20.

As the output means of the repair plan, print mans for printing the repair plan in a predetermined format may be provided instead of the display unit 26 or in addition to the display unit 26.

Figure 2:
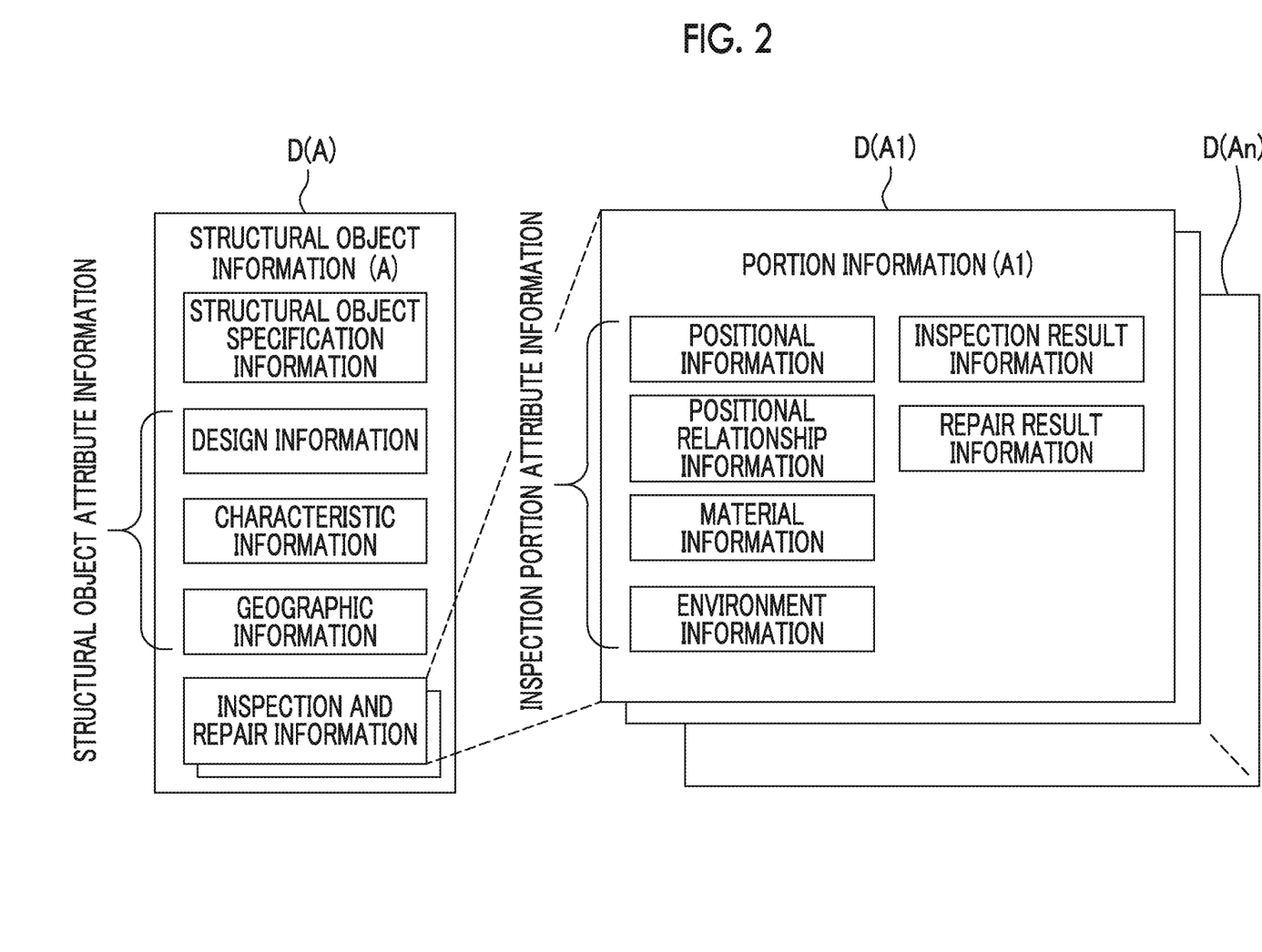
FIG. 2 is a diagram showing a data configuration of structural object information of a reference structural object.
Figure 3:
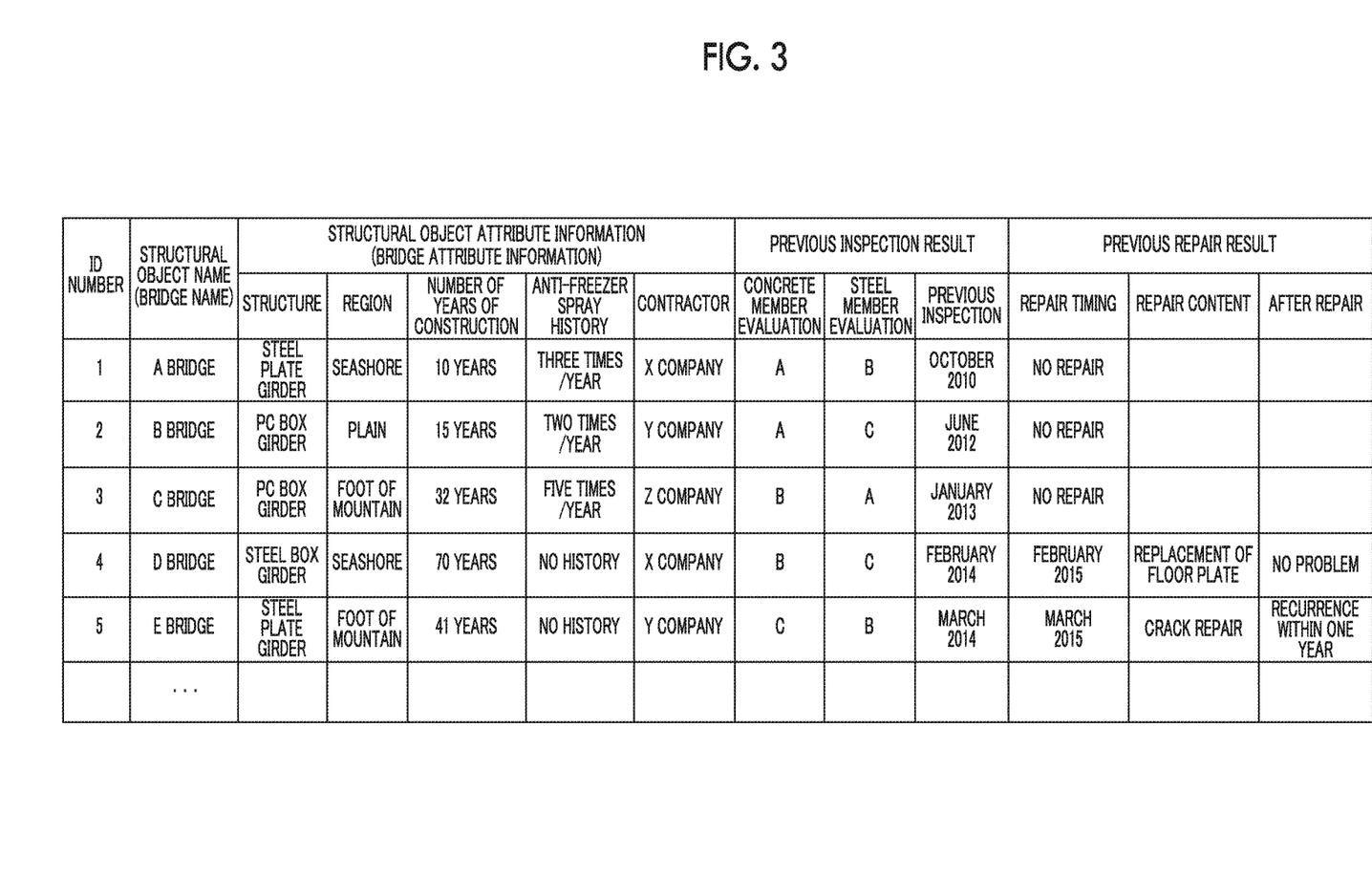
FIG. 3 is a table showing a specific example of structural object information in a case where the reference structural object is a bridge.
Figure 4:
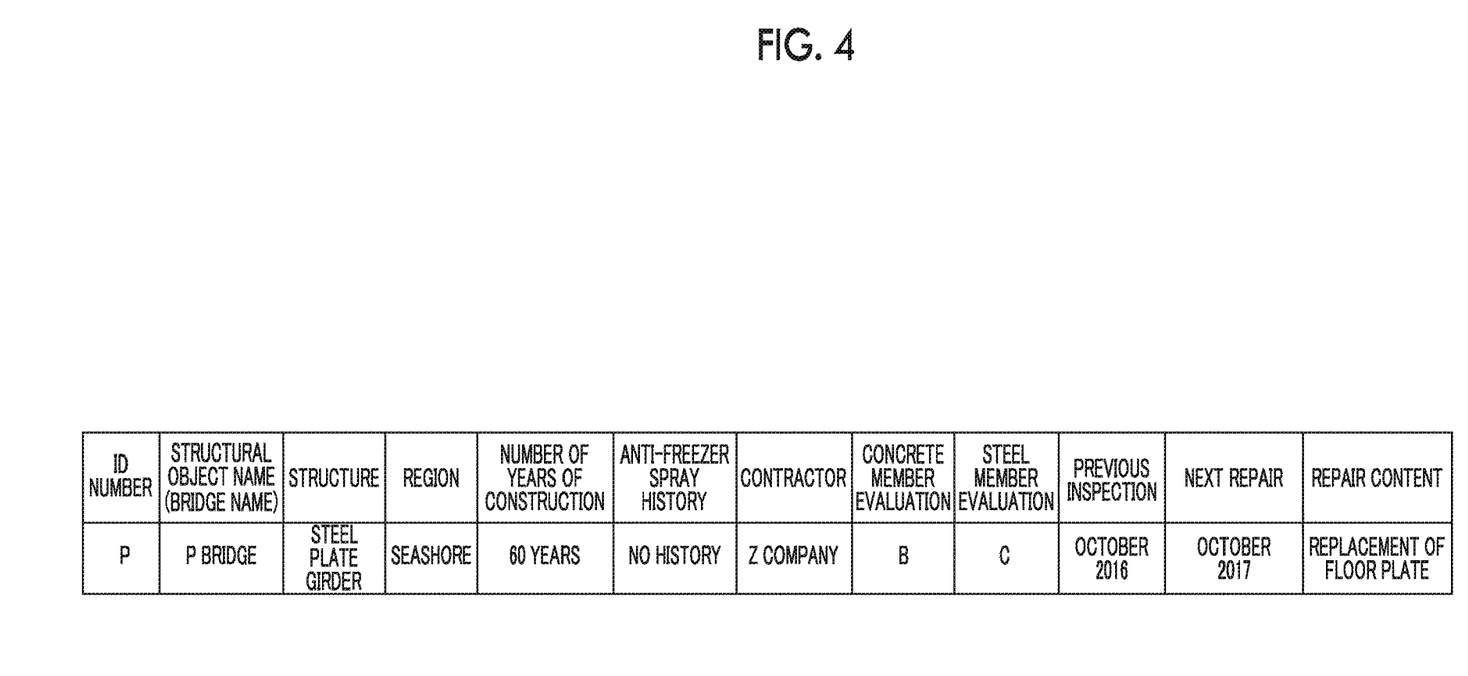
FIG. 4 is a diagram showing an output example of a repair plan.

FIG. 2 is a diagram showing a data configuration of the structural object information of the reference structural object, and FIG. 3 is a table showing a specific example of the structural object information in a case where the reference structural object is a bridge. FIG. 4 is a diagram showing an output example of the repair plan.

In the example shown in FIG. 2, structural object information D(A) of a reference structural object A includes structural object specification information and structural object attribute information of the reference structural object A, and inspection and/or repair information items (portion information items D(A1), . . . , and D(An)) of inspection portions of the reference structural object A.

The structural object specification information is information for specifying the reference structural object A. In the example shown in FIG. 3, the structural object specification information includes an identification (ID) number which is uniquely assigned to reference structural object in the structural object information DB 50 and a structural object name (bridge name).

The structural object attribute information includes a structural object of the reference structural object A, structure information regarding a design, design information, characteristic information, and geographic information. For example, the structure information is information (rigid-frame bridge, suspension bridge, cable-stayed bridge, arch bridge, or movable bridge (drawbridge)) regarding a basic structure of the structural object, a material (steel, concrete, mortar, brick, or stone, or combinations thereof), information items (a material and/or a shape (a steel plate girder, a steel box girder, or a prestressed concrete (PC) box girder, or a material and/or a shape of a bridge pier) of a bridge girder) regarding the structures of the portions of the structural object, design information, purpose of use (for example, for vehicles (the number of lanes), for person or motorcycles, or aqueduct). For example, the characteristic information is a time elapsing after completion or opening, a time elapsing after inspection and/or repair, a contractor, an inspection and/or repair company. For example, the geographic information is positional information (global positioning system (GPS) information), local information (distance from forest, river, lake and/or sea, seashore, plain, foot of mountain, and strength of ground), climate information (the frequency of rain or snow, the (annual, seasonal, maximum, and average) amount of rainfall or snowfall, the occurrence frequency of lightning strikes and gusts, the (annual, seasonal, maximum, and average) damage situation caused by lightning strikes and/or gusts, or the occurrence frequency of typhoon), or utilization information of the occurrence frequency of earthquake, maximum seismic intensity, average seismic intensity, or traffic volume. In the example shown in FIG. 3, the structural object attribute information (bridge attribute information) includes information as structure information regarding the material and/or structure of the bridge girder, information as the attribute information regarding the number of years of construction, or anti-freezer spray history and contractor for concrete parts, and information as the geographic information regarding a region in which the bridge is constructed.

The inspection and/or repair information items (portion information items D(A1), . . . , and D(An)) include positional information, positional relationship information, material information, environment information, inspection result information, and repair result information. The positional information is information (for example, coordinate information or GPS information) for specifying positions of the inspection portions A1, . . . , and An in the reference structural object A. For example, the positional relationship information is a distance from another bridge girder and bridge pier or positional information (distance) with a joining portion and/or damaged portion. The material information is information indicating a material of the inspection portion. The environment information is information indicating the environment of the inspection portion, and is, for example, information such as direction and/or orientation or whether the inspection portion faces the sea or does not face the sea.

The inspection result information is information indicating the past inspection result of the inspection portion, and is, for example, an inspection date and time, whether or not the inspection portion is damaged, the type of damage, the degree of damage (the size (length and width) of a crack, the orientation of the crack, a change in crack with time, or the spray history of the anti-freezer).

The repair result information is information regarding the past repair result of the inspection portion, and is stored in association with the inspection result information for every stage. For example, the repair result information includes a repair date and time, the content of the repair, and the result of follow-up observation after the repair.

In the example shown in FIG. 3, the inspection result information (the previous-stage inspection result) includes information indicating the inspection date and time of the inspection portion or an evaluation value (concrete member evaluation or steel member evaluation (for example, A (minor deterioration), B (degraded), or C (serious deterioration)) for every member, and the repair result information (previous-stage repair result) includes information indicating an observation result for a predetermined period after the repair, the repair content, or a repair conduction timing of the inspection portion.

The structural object similarity determination unit 22 compares the structural object attribute information included in the structural object information regarding the reference structural object within the structural object information DB 50, which is acquired by the structural object information search unit 18, and determines that the reference structural object of which the number of matching information items is largest or the reference structural object of which the number of matching information items is equal to or greater than a predetermined percentage is similar to the target structural object. The structural object information of the similar reference structural object is extracted from the structural object information DB 50. In a case where the similar reference structural object is not found, the number of structural object attribute information items as comparison targets may decrease, and then, the similarity of the reference structural object may be determined again.

The inspection result similarity determination unit 24 acquires the inspection and/or repair information of each inspection portion of the reference structural object from the structural object information of the reference structural object specified by the structural object similarity determination unit 22, and acquires multi-dimensional parameters by digitizing the inspection result information items of the target structural object and the reference structural object for every information item.

In the example shown in FIGS. 3 and 4, in a case where multi-dimensional parameters are generated by using A evaluation=4 points, B evaluation=3 points, and C evaluation=2 points in the concrete member evaluation, the multi-dimensional parameters of A Bridge which is the reference structural object and P Bridge which is the target structural object are as follows.

Pa(1) (1: A Bridge)=(concrete member evaluation, steel member evaluation)=(4, 3)

Pa(2) (2: B Bridge)=(concrete member evaluation, steel member evaluation)=(4, 2)

Pa(3) (3: C Bridge)=(concrete member evaluation, steel member evaluation)=(3, 4)

Pa(4) (4: D Bridge)=(concrete member evaluation, steel member evaluation=(3, 2)

. . . .

Pa(P) (P: P Bridge)=(concrete member evaluation, steel member evaluation)=(3, 2)

For example, in a case where the multi-dimensional parameters are calculated, a coefficient (for example, the larger the coefficient, the longer the time elapsing after the inspection is conducted) corresponding to a time elapsing after the inspection is conducted may be multiplied.

Figure 5:
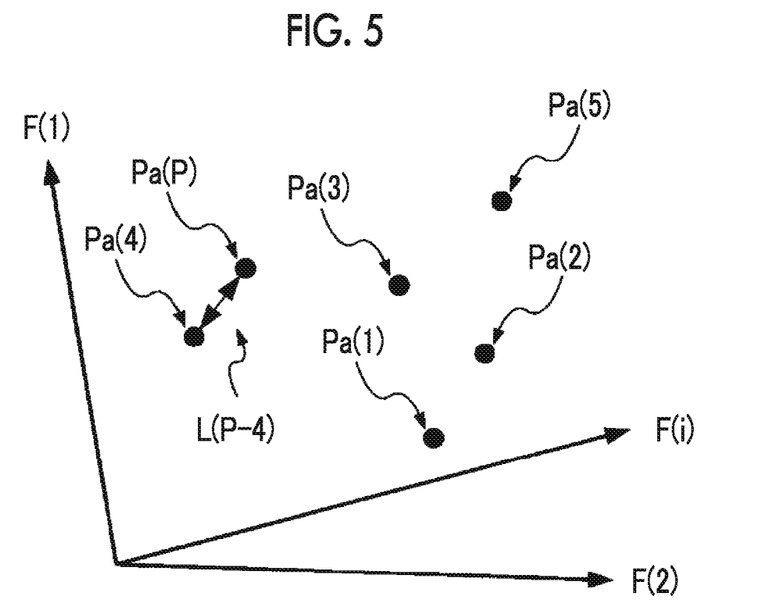
FIG. 5 is a diagram for describing a similarity determination method of the structural object information.

Subsequently, the inspection result similarity determination unit 24 calculates a Euclid distance L from the multi-dimensional parameters of the reference structural object and the target structural object. As shown in FIG. 5, the multi-dimensional parameter is defined as the Euclid distance L in a case where inspection result information items F(1), F(2), . . . , and F(i) are digitized and the digitized information items are plotted in a multi-dimensional space.

In the above-described example, since $L(P-4)=\{(3-3)^2+(2-2)^2\}^{(1/2)}=0$ and a Euclid distance L(P-4) between D Bridge and P Bridge is minimized (shortest), D bridge having an ID of 4 is specified as the reference structural object to which the inspection result information is similar. FIG. 5 illustrates that Pa(4) and Pa(P) are separated from each other for simplicity of illustration.

The inspection result similarity determination unit 24 extracts the inspection result information item of each inspection portion of the reference structural object similar to the inspection result information of the target structural object and the repair result information corresponding to the inspection result information. The repair plan generation unit 20 generates the repair plan based on the extracted repair result information, and outputs the generated repair plan to the display unit 26. Accordingly, the repair plan shown in FIG. 4 is displayed on the display unit 26. In the example shown in FIG. 4, a message of "replacement of floor plate" is displayed as the repair content of P Bridge, similarly to D Bridge which is the reference structural object. "October 2017" which is one year after the previous-stage inspection performed in the same timing as that of D Bridge which is the reference structural object is displayed as a timing when the next repair of P Bridge is to be performed.

A display method of the repair plan is not limited to FIG. 4. For example, a plurality of repair contents and repair timings may be displayed while being assigned values or ranks indicating recommendation ratings. Alternatively, information (information regarding an effect to be predicted in a case where the repair is performed) indicating an observation result for a predetermined period after the same repair is performed in the reference structural object may be displayed side by side together with the plurality of repair contents so as to be comparable. Cost information including a cost estimate or cost required to repair the reference structural object may be stored in the structural object information DB 50, and the cost information may be displayed together with the display of the plurality of repair contents in a comparable format (for example, side by side).

The determination of the similarity between the target structural object and the reference structural object is not limited thereto. Similarly to the comparison of the inspection result information items, the multi-dimensional parameters may be generated by digitizing the structural object attribute information items, and may be compared with the Euclid distance between the multi-dimensional parameters.

[Configuration of Inspection Device]

Figure 6:
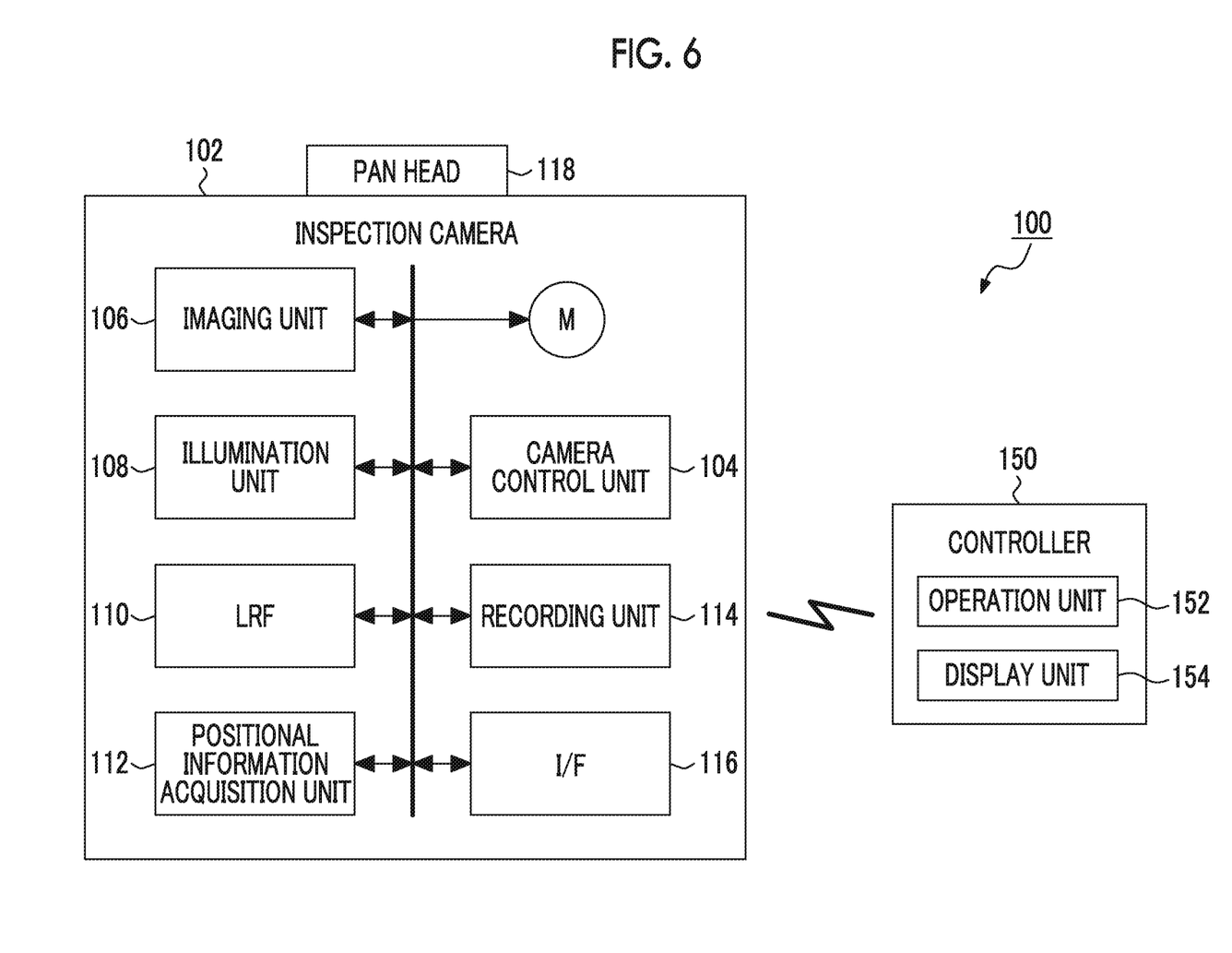
FIG. 6 is a block diagram showing a configuration of an inspection device according to the embodiment of the present invention.

Next, an example of the inspection device 100 will be described with reference to FIGS. 6 and 7. FIG. 6 is a block diagram showing a configuration of the inspection device according to the embodiment of the present invention.

The inspection device 100 according to the present embodiment includes an inspection camera 102, and a controller 150. The inspection camera 102 includes a camera control unit 104, an imaging unit 106, an illumination unit 108, an LRF 110, a positional information acquisition unit 112, a recording unit 114, and a communication interface (I/F) 116.

The camera control unit 104 includes a CPU that controls the operations of the units of the inspection camera 102, a ROM that stores a control program, and an SDRAM that is able to be used as a work area of the CPU. The camera control unit 104 receives an operation unit of the operator through the controller 150, transmits the control signal corresponding to the operation input to the units of the inspection camera 102 through a bus, and controls the operations of the units.

The controller 150 includes an operation unit 152 and a display unit 154. A tablet terminal that includes the display unit 154 (for example, liquid crystal display) for displaying an image captured by the inspection camera 102 and a GUI for operation and the operation unit 152 as a touch panel formed on a front surface of the display unit 154 may be used as the controller 150.

The communication interface (I/F) 116 is means for communicating with the controller 150. Wired communication (for example, connection using a USB cable, LAN, WAN, or Internet connection) or wireless communication (for example, LAN, WAN, Internet connection, Bluetooth (registered trademark), or infrared communication) may be used as a communication method between the inspection camera 102 and the controller 150.

The imaging unit 106 is means for imaging a subject (the inspection portion of the target structural object), and includes, for example, a zoom lens, a focus lens, a stop, and an imaging element. An image (still image or a motion picture) captured by the imaging unit 106 is transmitted to the controller 150 through the I/F 116, and is displayed on the display unit 154. The image is recorded in the recording unit 114 (for example, a USB memory or a SD card) according to an operation input from the operation unit 152. The recording unit 114 may be provided at the controller 150, or may be provided at both the inspection camera 102 and the controller 150.

The illumination unit 108 is means for illuminating the subject, and includes, for example, light emitting diode (LED).

The laser range finder (LRF) 110 includes a laser diode, and is a device that performs distance measurement from by a traveling time from when the subject is irradiated with a laser beam to when reflection light is reflected or projects a laser aiming point onto the subject. The operator moves a pan head 118 through the operation unit 152 by a motor M while checking the position or posture of the inspection camera 102 for the subject by checking the laser aiming point projected onto the subject on the display unit 154 of the controller 150. Thus, the operation can control the posture of the inspection camera 102.

The positional information acquisition unit 112 acquires the positional information (for example, GPS information) of the inspection portion. The positional information of the inspection portion may be acquired by providing an IC chip in which the positional information is stored in each inspection portion of the target structural object and performing communication between the inspection camera 102 and the IC chip.

Figure 7:
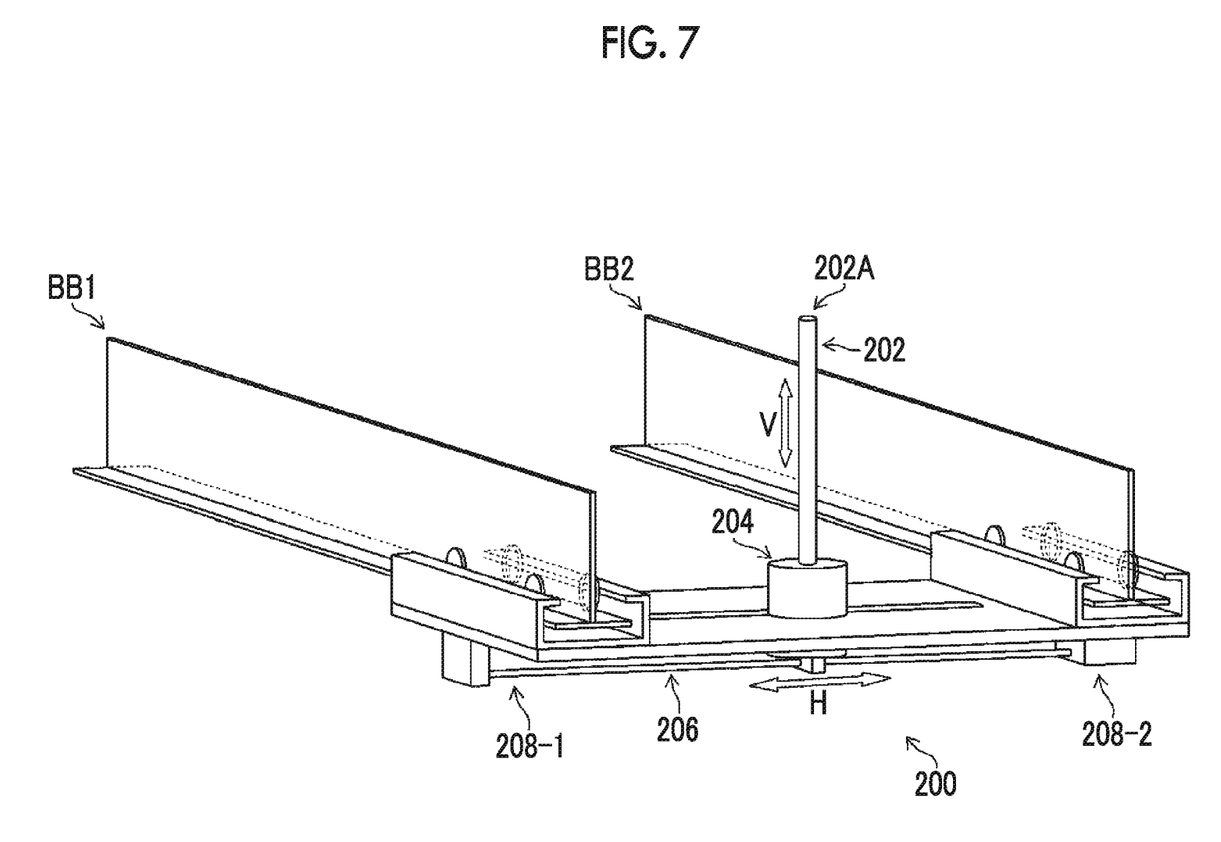
FIG. 7 is a perspective view showing an example of attachment and operation methods of an inspection camera in a case where the target structural object is the bridge.

FIG. 7 is a perspective view showing an example of attachment and operation methods of the inspection camera in a case where the target structural object is the bridge.

As shown in FIG. 7, an inspection camera attachment member 200 includes a pole 202, a camera installation portion 202A, a pole base portion 204, a rail 206, and attachment members 208-1 and 208-2.

The attachment members 208-1 and 208-2 are members for fixing the rail 206 to the target structural object, and are fixed to bridge piers BB1 and BB2, respectively. The number or kind of attachment members 208-1 and 208-2 may be changed depending on the inspection portions of the target structural object, an interval between the bridge piers, and the number of bridge piers. Wheels capable of being driven by a motor are attached to the attachment members 208-1 and 208-2, and thus, the attachment members are movable along the bridge piers BB1 and BB2 according to an instruction input from the controller 150.

The pole 202 may expand and contract in a vertical direction (V direction) in a manual manner or by being driven by a motor. The camera installation portion 202A for attaching the pan head 118 of the inspection camera 102 is formed at an upper end portion of the pole 202 in the diagram.

The pole base portion 204 is formed at a lower end portion of the pole 202, and the pole base portion 204 is attached to the rail 206. For example, the pole base portion 204 is movable in a horizontal direction (H direction) along the rail 206 through a ball screw.

The method of performing the inspection by attaching the inspection camera 102 to a part of the structural object such as the bridge girder or the bridge pier is not limited to the example of FIG. 7. The shape of the rail and the number or shapes of attachment members are determined depending on the arrangement and shape of bridge piers. A suspension type in which the inspection camera 102 is hung by the bridge girder through the pole or a high place installation type in which the inspection camera 102 is installed in a high place may be used.

The inspection camera 102 may be mounted on an unmanned aerial vehicle (for example, multicopter or drone), and the target structural object may be captured. In a case where the unmanned aerial vehicle is used, the positional information of the inspection portion may be acquired by providing the IC chip in which the positional information is stored in each inspection portion of the target structural object and performing the communication between the inspection camera 102 and the IC chip, or the GPS information may be used.

[Repair Plan Drafting Support Process]

Figure 8:
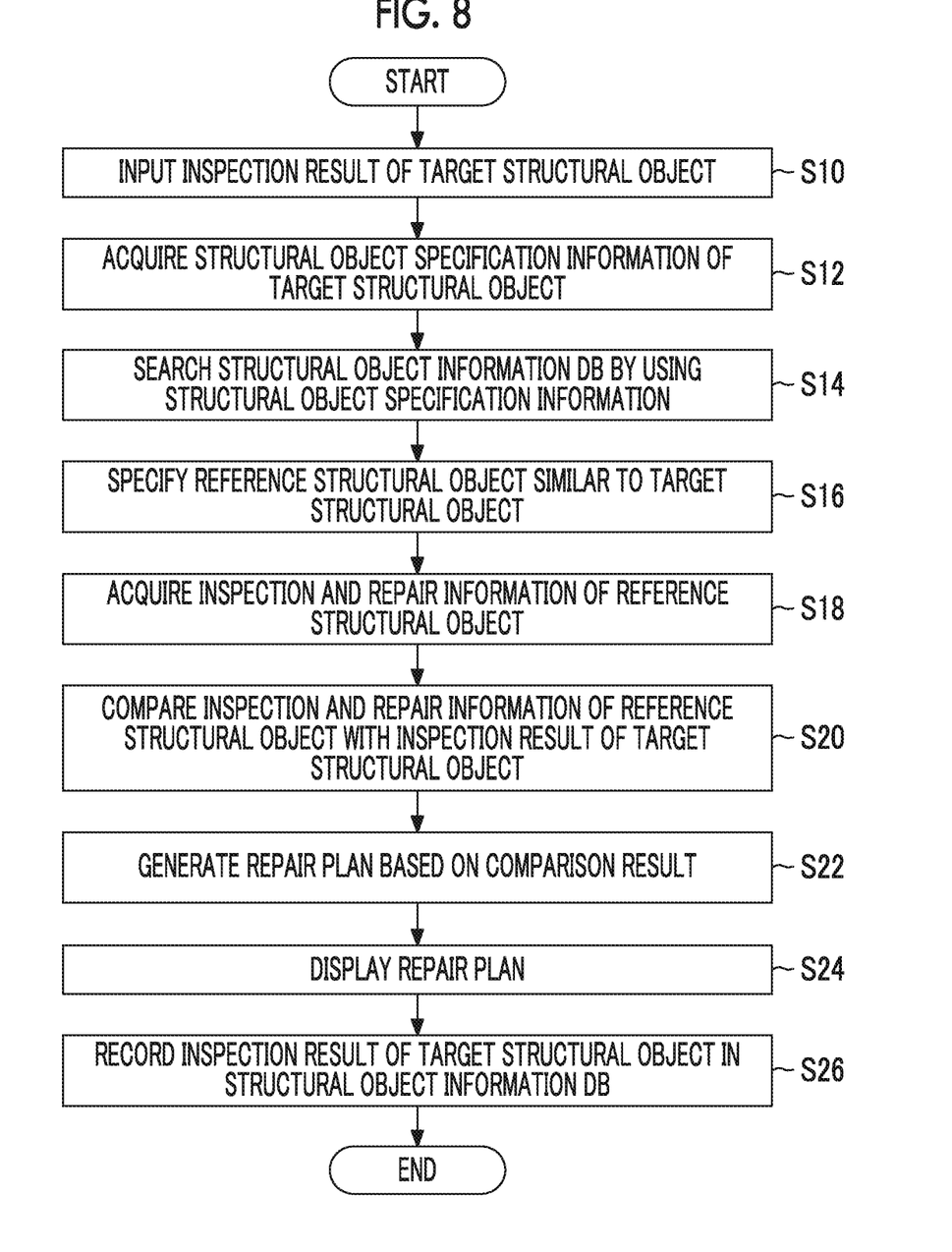
FIG. 8 is a flowchart showing a process of a repair plan drafting support method according to the embodiment of the present invention.

FIG. 8 is a flowchart showing a process of a repair plan drafting support method according to the embodiment of the present invention.

Initially, the repair plan drafting support system 10 receives an input of the inspection result information of the target structural object from the inspection device 100 through the I/F 16 (step S10). The structural object information search unit 18 acquires the structural object specification information of the target structural object from the inspection result information (step S12), and searches for the structural object information of the reference structural object stored in the structural object information DB 50 based on the structural object specification information (step S14). The structural object information search unit 18 specifies the similar reference structural object having the structural object information (structural object attribute information) similar to the target structural object (step S16).

The inspection result similarity determination unit 24 acquires the inspection and/or repair information of the similar reference structural object from the structural object information DB 50 (step S18), compares the inspection and/or repair information of the similar reference structural object with the inspection result of the target structural object, and specifies the inspection result information of the reference structural object used in the generation of the repair plan (step S20).

The repair plan generation unit 20 generates the repair plan of the target structural object based on the inspection result information specified in step S20 (step S22). Specifically, the repair plan generation unit 20 acquires the inspection result information specified in step S20 and the repair result information corresponding to the inspection result information, and outputs the repair content (repair content indicating that "no problem" after the repair in FIG. 3) indicating that the result after the repair is favorable, as the repair plan. The repair plan generation unit 20 calculates a timing (scheduled repair date and time) when the repair corresponding to the repair content is to be conducted based on the inspection result information specified in step S20 and a time interval of the inspection and repair date and time of the repair result information corresponding to the inspection result information, and outputs the calculated timing. The scheduled repair date and time may be adjusted based on the structural object attribute information. For example, in a case where the number of years of the construction of a target building is longer than that of the reference structural object, in a case where the number of times of the anti-freezer spray is large in the anti-freezer spray history, in a case where the local information is the "seashore", or in a case where there is an element that may increase a degradation rate, the scheduled repair date and time may advance.

A progression rate of the damage may be estimated (predicted) while referring to positional relationship information indicating a positional relationship between the inspection portion and an important portion (a portion having high importance or a portion of which an importance indicator is equal to or greater than a threshold value) in terms of a structure in the target structural object or a damaged portion, or a portion damaged in the past or a portion on which the repair is conducted, and the repair content or the scheduled repair date and time may be adjusted based on the prediction result. For example, in a case where the damage of the target structural object is the crack and the orientation of the crack is towards the joining portion in which the bridge girder or the bridge pier is joined by a bolt or through welding, the repair plan generation unit 20 (preferential inspection portion information acquisition means or preferential inspection portion specification means) gives a high repair priority to the damaged portion, and thus, the scheduled repair date and time may advance such that the damaged portion becomes the preferential inspection portion. The preferential inspection portion information indicating the position and priority (importance) of the preferential inspection portion may be previously stored in the structural object information DB 50, and may be acquired by the repair plan generation unit 20 (preferential inspection portion information acquisition means) from the structural object information DB 50.

The inspection plan and the repair plan (for example, legal inspection related to the target structural object) previously planned for the target structural object may be received through the I/F 16 (plan input means), and the repair plan may be generated so as to match the scheduled timing of the inspection plan and the repair plan.

Subsequently, the repair plan generation unit 20 outputs the repair plan generated in step S22 to the display unit 26 (step S24).

The inspection result information of the target structural object is recorded in the structural object information DB 50 according to an instruction from the repair plan drafting support system 10 (step S26). The inspection result information of the target structural object may be recorded in the structural object information DB 50 after the repairing is performed based on the repair plan generated in step S22.

According to the present embodiment, the inspection result information items of the reference structural object are compared based on the inspection result information of the target structural object, and thus, it is possible to draft an objective and high-accurate repair plan by easy means. Thus, it is possible to more effectively support the drafting of the repair plan.

The present invention may be realized as a repair plan drafting support program causing a computer to realize the process or a non-transitory recording medium or a program product storing the program thereon.

EXPLANATION OF REFERENCES

10: repair plan drafting support system
12: control unit
14: input unit
16: communication interface
18: structural object information search unit
20: repair plan generation unit
22: structural object similarity determination unit
24: inspection result similarity determination unit
26: display unit
50: structural object information DB
100: inspection device

What is claimed is:

1. A repair plan drafting support system that supports drafting of a repair plan, the system comprising:
a recording unit that records past inspection results and past repair results of reference structural objects;
an input unit that receives an input of an inspection result of a target structural object which is a drafting target of the repair plan;
a generation unit that compares the past inspection results and the past repair results of the reference structural objects with the inspection result of the target structural object, and generating a repair plan of the target structural object; and
an output unit that outputs the repair plan generated by the generation unit,
wherein each of the past inspection results of the reference structural objects includes multi-dimensional parameters indicating evaluation values of a plurality of members of the reference structural objects, and the inspection result of the target structural object includes multi-dimensional parameters indicating evaluation values of a plurality of the members of the target structural object, and
wherein the generation unit extracts a past inspection result and a past repair result of a reference structural object among the reference structural objects which is similar to the inspection result of the target structural object based on the multi-dimensional parameters of the reference structural objects and the inspection result of the target structural object, and generates the repair plan based on the extracted past inspection result and the extracted past repair result.

2. The repair plan drafting support system according to claim 1,
wherein the recording unit records attribute information including at least one of utilization information, environment information, or structure information of the reference structural objects together with the past inspection results and the past repair results of the reference structural objects,
the input unit receives an input of attribute information of the target structural object in a case where the inspection result is input, and
the generation unit determines a similarity between the target structural object and the reference structural objects by comparing the attribute information of the reference structural objects and the target structural object, extracts the past inspection result similar to the inspection result of the target structural object among the past inspection results and the past repair results of the reference structural objects, and generates the repair plan based on the extracted past inspection result and the extracted past repair result corresponding to the inspection result.

3. The repair plan drafting support system according to claim 1,
wherein the recording unit records attribute information including at least one of utilization information, environment information, or structural information for each of inspection portions of the reference structural objects together with the past inspection result and the past repair result of the reference structural objects,
the input unit receives an input of attribute information for each of the inspection portions of the target structural object in a case where the inspection result is input, and
the generation unit determines a similarity between each of the inspection portions of the reference structural objects and the target structural object by comparing the attribute information of each of the inspection portions of the reference structural objects and the target structural object, extracts the past inspection result similar to the inspection result of the inspection portion of the target structural object among the past inspection results and the past repair results of each of the inspection portions of the reference structural objects, and generates the repair plan based on the extracted past inspection result and the extracted past repair result corresponding to the inspection result.

4. The repair plan drafting support system according to claim 2,
wherein the generation unit generates multi-dimensional parameters by digitizing the attribute information of the reference structural object and the target structural object, and determines that a shorter a Euclid distance between the multi-dimensional parameters, the higher the similarity between the target structural object and the reference structural object.

5. The repair plan drafting support system according to claim 3,
wherein the generation unit generates multi-dimensional parameters by digitizing the attribute information of the reference structural object and the target structural object, and determines that a shorter a Euclid distance between the multi-dimensional parameters, a higher the similarity between the target structural object and the reference structural object.

6. The repair plan drafting support system according to claim 2,
wherein the generation unit generates multi-dimensional parameters by digitizing the past inspection result of the reference structural object and the inspection result of the target structural object, and determines that a shorter a Euclid distance between the multi-dimensional parameters, a higher a similarity between the past inspection result of the reference structural object and the inspection result of the target structural object.

7. The repair plan drafting support system according to claim 3,
wherein the generation unit generates multi-dimensional parameters by digitizing the past inspection result of the reference structural object and the inspection result of the target structural object, and determines that a shorter a Euclid distance between the multi-dimensional parameters, a higher a similarity between the past inspection result of the reference structural object and the inspection result of the target structural object.

8. The repair plan drafting support system according to claim 1,
wherein the generation unit acquires a degree of damage of the target structural object changing with time for a predetermined past period among the past inspection results and the past repair results of the reference structural objects at multiple past points of time, predicts a progression of a damage based on an inspection result of the damage, and generates the repair plan based on a prediction result of the progression of the damage.

9. The repair plan drafting support system according to claim 8, further comprising:
a preferential inspection portion information acquisition unit that acquires preferential inspection portion information indicating a preferential inspection portion of the target structural object to which a high repair priority is given,
wherein the generation unit estimates a progression direction and a progression rate of the damage based on the prediction result of the progression of the damage, and generates the repair plan based on a relationship between an estimation result of a progression direction and a progression rate of the damage and the preferential inspection portion.

10. The repair plan drafting support system according to claim 9, further comprising:
a preferential inspection portion specification unit that generates the preferential inspection portion information by specifying a preferential inspection portion of inspection target portions of the target structural object based on at least one information of information regarding importance of each of the inspection target portions in terms of structure, design information of each of the inspection target portions, or environment information in which each of the inspection target portions is positioned among inspection target portions of the target structural object.

11. The repair plan drafting support system according to claim 1, further comprising:
a plan input unit that receives an input of at least one plan of an inspection plan or a repair plan of the target structural object,
wherein the generation unit generates the repair plan based on the plan received by the plan input unit.

12. The repair plan drafting support system according to claim 11,
wherein the plan input unit receives an input of an inspection timing determined for the target structural object, and
the generation unit matches an inspection or repair timing of the target structural object with the inspection timing based on the repair plan.

13. The repair plan drafting support system according to claim 12,
wherein the output unit outputs a cost estimate and an effect to be predicted for every generated repair plan in a comparable format.

14. The repair plan drafting support system according to claim 1, wherein
the recording unit further records attribute information including at least one of utilization information, environment information, or structure information of the reference structural objects, the past inspection results and the past repair results of the reference structural objects;
the generation unit extracts first reference structural objects having attribute information similar to attribute information of the target structural object among the reference structural objects, and
wherein the generation unit extracts the past inspection result and the past repair result of the reference structural object among the first reference structural objects which is similar to the inspection result of the target structural object based on the multi-dimensional parameters of the first reference structural objects and the inspection result of the target structural object, and generates the repair plan based on the extracted past inspection result and the extracted past repair result.

15. The repair plan drafting support system according to claim 1, wherein
the recording unit further records attribute information including at least one of utilization information, environment information, or structure information of reference structural objects, the past inspection results and the past repair results of the reference structural objects;
the generation unit extracts first reference structural objects having attribute information similar to attribute information of the target structural object among the reference structural objects, and
the generation unit extracts the past inspection result and the past repair result of a reference structural object among the first reference structural objects which is similar to the inspection result of the target structural object based on a Euclid distance between the multi-dimensional parameters of the first reference structural objects and the inspection result of the target structural object, and generates the repair plan based on the extracted past inspection result and the extracted past repair result.

16. A repair plan drafting support method of supporting drafting of a repair plan, the method comprising:
recording past inspection results and past repair results of reference structural objects;
receiving an input of an inspection result of a target structural object which is a drafting target of the repair plan, the inspection result of the target structural object includes multi-dimensional parameters indicating evaluation values of a plurality of members of the target structural object;
comparing the past inspection results and the past repair results of the reference structural objects with the inspection result of the target structural object, each of the past inspection results of the reference structural objects includes multi-dimensional parameters indicating evaluation values of a plurality of the members of the reference structural objects;
extracting a past inspection result and a past repair result of a reference structural object among the reference structural objects which is similar to the inspection result of the target structural object based on the multi-dimensional parameters of the reference structural objects and the inspection result of the target structural object; and generating a repair plan of the target structural object based on the extracted past inspection result and the extracted past repair result; and outputting the generated repair plan.

17. A non-transitory computer readable recording medium storing a repair plan drafting support program, which supports drafting of a repair plan, causing a computer to realize:

a recording function of recording past inspection results and past repair results of reference structural objects;

an input function of receiving an input of an inspection result of a target structural object which is a drafting target of the repair plan, the inspection result of the target structural object includes multi-dimensional parameters indicating evaluation values of a plurality of members of the target structural object;

a generation function of comparing the past inspection results and the past repair results of the reference structural objects with the inspection result of the target structural object, each of the past repair results of the reference structural objects includes multi-dimensional parameters indicating evaluation values of a plurality of the members of the reference structural objects;

extracting a past inspection result and a past repair result of a reference structural object among the reference structural objects which is similar to the inspection result of the target structural object based on the multi-dimensional parameters of the reference structural objects and the inspection result of the target structural object; and generating a repair plan of the target structural object based on the extracted past inspection result and the extracted past repair result; and an output function of outputting the repair plan.

* * * * *